(12) United States Patent
Lee et al.

(10) Patent No.: US 10,114,694 B2
(45) Date of Patent: Oct. 30, 2018

(54) METHOD AND CONTROLLER FOR RECOVERING DATA IN EVENT OF PROGRAM FAILURE AND STORAGE SYSTEM USING THE SAME

(71) Applicant: Storart Technology Co., Ltd., Hsinchu (TW)

(72) Inventors: Hou Yun Lee, Hsinchu (TW); Jui Hui Hung, Hsinchu (TW)

(73) Assignee: Storart Technology Co. Ltd., Hsinchu (TW)

( * ) Notice: Subject to any disclaimer, the term of this patent is extended or adjusted under 35 U.S.C. 154(b) by 0 days.

(21) Appl. No.: 15/175,137

(22) Filed: Jun. 7, 2016

(65) Prior Publication Data

US 2017/0351571 A1    Dec. 7, 2017

(51) Int. Cl.
| | |
|---|---|
| *G06F 11/10* | (2006.01) |
| *G06F 13/40* | (2006.01) |
| *G11C 29/52* | (2006.01) |
| *G06F 3/06* | (2006.01) |

(52) U.S. Cl.
CPC .......... *G06F 11/1068* (2013.01); *G06F 3/064* (2013.01); *G06F 3/0619* (2013.01); *G06F 3/0685* (2013.01); *G06F 13/4022* (2013.01); *G11C 29/52* (2013.01)

(58) Field of Classification Search
CPC ............ G06F 11/1044; G06F 11/1076; G06F 11/1068; G06F 11/1072; G06F 3/064; G06F 3/0619; G06F 3/0685
See application file for complete search history.

(56) References Cited

U.S. PATENT DOCUMENTS

| | | | | |
|---|---|---|---|---|
| 5,948,110 | A * | 9/1999 | Hitz | .................... G06F 11/1076 |
| | | | | 711/114 |
| 7,827,439 | B2 * | 11/2010 | Mathew | .............. G06F 11/1076 |
| | | | | 711/114 |
| 8,700,951 | B1 | 4/2014 | Call et al. | |
| 9,058,288 | B2 * | 6/2015 | Golov | ................. G06F 11/1044 |
| 2013/0019057 | A1 | 1/2013 | Stephens | |
| 2015/0331746 | A1 | 11/2015 | O'Connor | |

\* cited by examiner

*Primary Examiner* — Shelly A Chase
(74) *Attorney, Agent, or Firm* — Che-Yang Chen; Law Offices of Scott Warmuth

(57) ABSTRACT

A method and a controller for recovering data in event of a program failure and a storage system using the method and the controller are disclosed. The controller includes main units of a parity generator, a volatile memory module and a processor. With a parity in the volatile memory module and successfully programmed sub-data, a program failed write data can be recovered and correctly programmed. The method of the present invention has advantages of saving use of storage resources and extending lifetime of the storage system than other methods for recovering data in event of a program failure.

16 Claims, 3 Drawing Sheets

METHOD AND CONTROLLER FOR RECOVERING DATA IN EVENT OF PROGRAM FAILURE AND STORAGE SYSTEM USING THE SAME

FIELD OF THE INVENTION

The present invention relates to a method and a controller for recovering data in event of a program failure and a storage system using the method and the controller. More particularly, the present invention relates to a method and a controller for recovering data in event of a program failure by utilizing parity part stored in a DRAM (Dynamic Random Access Memory) module and a storage system using the method and controller.

BACKGROUND OF THE INVENTION

Flash memory is widely used in storing digital data nowadays. It has many aspects of applications: flash memory chips can be aggregated to form a SSD (Solid State Disk) to be a key part of a notebook, or a pendrive as a portable storage device; one single flash memory chip may be packaged to form a micro SD card inserted in a smartphone for recording data. Take SSD as an example. Comparing with HDD (Hard Disk Drive), SSD has advantages of shockproof, compact size, low heat radiation and fast speed of read and write. Although HDD has higher bit-to-cost ratio than SSD, the distance therebetween is getting closer. SSD is replacing HDD to be the mainstream in storage.

Conventionally, storing data into SSD follows the following steps: sending data to a DRAM module, programming the data to the SSD, and removing the data in the DRAM module if the programming is successful. Sometimes, due to physical damage of flash memory cell or noise in the storing channel, program may fail. The host requesting storing data may not be informed the failed accident and process programming data again. This leads to data lost. Therefore, a method for safely programming data into SSD or other similar storage devices with flash memory chips is an important issue.

A conventional method for settle the issue is to apply RAID (Redundant Array of Independent Disks) 5 algorithm. RAID 5 is a solution covering storage efficiency, data safety and cost. It uses disk striping technology and needs at least 3 disks. RAID 5 is not to back up the stored data to have a duplicate but to store the data and corresponding parity in separate disks forming a system of RAID 5. If one disk is out of order, the data stored in that disk can be recovered by other parts of the data in other disks with the parity. The application of RAID 5 algorithm is just take the flash memory chip as the disk and process similar data allocation. Of course, concerning data safety, algorithm of RAID 6 or more advanced RAID level may be applied. Although the method has safe programming ability, a defect is that more flash memory chips are required to be used for storing parities. It is a kind of waste of resources.

Another solution is provided by the US Patent Application No. 20150355858. A method in said patent application includes storing data encoded with an Error Correction Code (ECC) in analog memory cells, by buffering the data in a volatile buffer and then writing the buffered data to the analog memory cells while overwriting at least some of the data in the volatile buffer with success indications. Upon detecting a failure in writing the buffered data to the analog memory cells, recovered data is produced by reading both the volatile buffer and the analog memory cells, assigning reliability metrics to respective bits of the recovered data depending on whether the bits were read from the volatile buffer or from the analog memory cells, and applying ECC decoding to the recovered data using the reliability metrics. Thus, the recovered data is re-programmed.

Said patent application provides a concrete and feasible solution to avoid program fail. However, there are some shortcomings. First, a volatile buffer is needed to temporarily store data (may include corresponding parity) in the analog memory cells (referring to flash memory cells). The availability and size of volatile buffer for the applied flash memory chip will influence the performance of data recovery. Secondly, according to the description of said patent application, a controller for carrying out the provided method should have a RAM (Random Access Memory) to buffer all write data as conventional the programming procedure does. Workload of the RAM is large and size of the RAM can not be reduced.

From the description above, an improved method for recovering data in event of a program failure and related controller and storage system are still desired.

SUMMARY OF THE INVENTION

This paragraph extracts and compiles some features of the present invention; other features will be disclosed in the follow-up paragraphs. It is intended to cover various modifications and similar arrangements included within the spirit and scope of the appended claims.

In order to settle the issues above, an aspect of the present invention is to provide a method for recovering data in event of a program failure. The method includes the steps of: A. receiving a write data to be programmed into a plurality of non-volatile memory units; B. generating a parity from the write data and separating the write data into a plurality of sub-data; C. storing the parity in a volatile memory; D. programming the write data into some of the non-volatile memory units with each sub-data being programmed into a corresponding non-volatile memory unit; E. determining if step D is successful; and F. if the result of step E is no, recovering the sub-data in at least one program-failed non-volatile memory unit with the parity in the volatile memory and other sub-data successfully programmed.

According to the present invention, the sub-data are separated according to the specification of RAID 5, RAID 6 or higher RAID level having parity information. The non-volatile memory unit may be a page, a block or a plane in a flash memory chip. The non-volatile memory unit may be a flash memory chip in a SSD or a portable storage device. The flash memory chip may be a NAND flash memory chip, a NOR flash memory chip, or a charge trap flash memory chip. The volatile memory may be a DRAM or a SRAM.

Another aspect of the present invention is a controller for recovering data in event of a program failure. The controller includes: a parity generator, for generating a parity from a write data; a volatile memory module, for storing and providing the parity; and a processor, electrically connected with the parity generator and the volatile memory module, for receiving a write data to be programmed into a plurality of non-volatile memory units, storing the parity in the volatile memory module, separating the write data into a plurality of sub-data, programming each sub-data into a corresponding non-volatile memory unit, determining if programming each sub-data is successful, and recovering the sub-data in at least one program-failed non-volatile memory unit with the parity in the volatile memory module and other sub-data successfully programmed.

Preferably, the sub-data are separated according to the specification of RAID 5, RAID 6 or higher RAID level having parity information. The non-volatile memory unit may be a page, a block or a plane in a flash memory chip. The non-volatile memory unit may be a flash memory chip in a SSD or a portable storage device. The flash memory chip may be a NAND flash memory chip, a NOR flash memory chip, or a charge trap flash memory chip. The volatile memory module may be a DRAM module or a SRAM module.

According to the present invention, the controller further includes: a host interface, electrically connected with the processor, for externally communicating with a host and transmitting the write data from the host to the processor; and a non-volatile memory interface, externally connected with the non-volatile memory units and electrically connected with the processor, for bridging communication for the non-volatile memory units and the processor.

Another aspect of the present invention is a storage system. The storage system includes: the controller mentioned above; and an array of non-volatile memory units connected to the controller.

Preferably, the sub-data are separated according to the specification of RAID 5, RAID 6 or higher RAID level having parity information. The non-volatile memory unit may be a page, a block or a plane in a flash memory chip. The non-volatile memory unit may be a flash memory chip in a SSD or a portable storage device. The flash memory chip may be a NAND flash memory chip, a NOR flash memory chip, or a charge trap flash memory chip. The volatile memory module may be a DRAM module or a SRAM module.

The present invention has below advantages for recovering data in event of a program failure in a flash-memory-based storage. First, conventional application of RAID with data recovery requires one or more disks for parities. The parities need to be stored till corresponding data is changed or removed. The method provided by the present invention saves the spare one. Secondly, the volatile memory module doesn't have to temporarily store the complete write data and the corresponding parity. It can improve the efficiency of the volatile memory module. Thirdly, since less flash memory units are programmed for one write, life time of the storage system can be extended. Therefore, the above issues can be effectively settled.

DETAILED DESCRIPTION OF THE PREFERRED EMBODIMENTS

The present invention will now be described more specifically with reference to the following embodiments.

Figure 1:
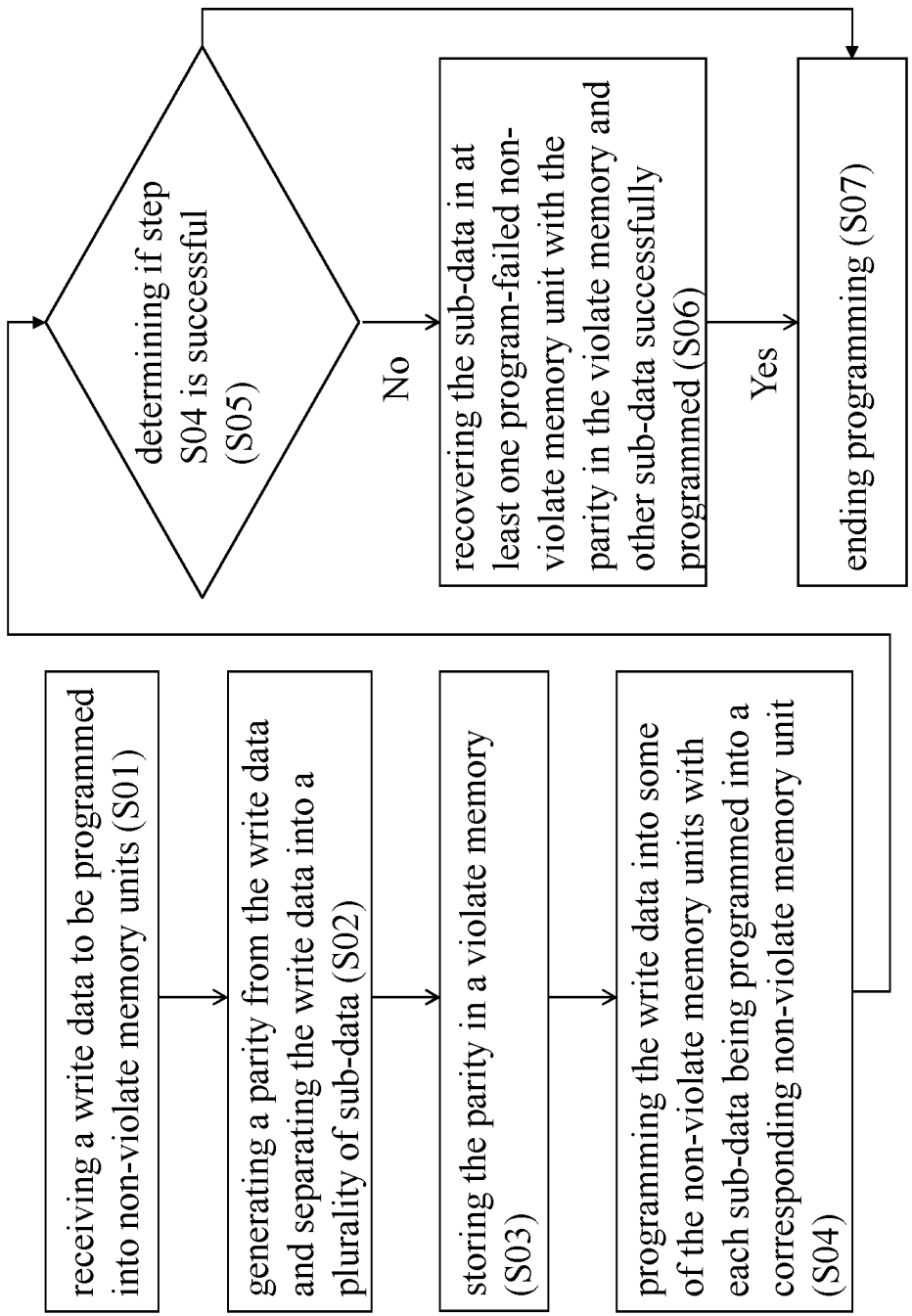
FIG. 1 is a flow chart of a method for recovering data in event of a program failure according to the present invention.

Please refer to FIG. 1. FIG. 1 is a flow chart of a method for recovering data in event of a program failure according to the present invention. It should be noticed that the method can be applied to an SSD installed in a laptop or a desktop computer. The method can also be applied to a USB pendrive as a portable storage. Namely, a flash-memory-based storage is applicable. A best implement could be a controller for operating SSDs.

The first step of the method provided in the present invention is to receive a write data to be programmed into a number of non-volatile memory units (S01). In practice, the write data comes from a host to program into a SSD or a USB pendrive. The host may be a CPU (Central Processing Unit) in a desktop computer having the SSD. It may also be a CPU of a laptop computer connecting to the USB pendrive. As well, the non-volatile memory unit used in the present invention is flash-memory-based.

The second step of the method is generating a parity from the write data and separating the write data into a number of sub-data (S02). According to the present invention, the sub-data separated and the parity generated are in accordance with the specification of RAID (Redundant Array of Independent Disks) 5. It is to say that the parity can be used to recover one sub-data which is failed to be programmed. However, RAID 5 requests the sub-data and the parity to be stored in separate disks. The disks should be of the same type. The difference between RAID 5 and the present invention is that the disclosed method stores the parity in a storing unit which is different from the one for storing the sub-data. This will be described in detail later. Alternatively, specifications of RAID 6 or higher RAID level having parity information can be applied to determine contents of the sub-data and the parity. For example, if the specification RAID 6 is applied, two sub-data failed to program can be recovered.

Here, it is emphasized that the non-volatile memory unit may be a page, a block or a plane in a flash memory chip. Under this condition, each page, block or plane in the flash memory chip can be deemed as the disk in RAID specification (referring to the specification of RAID 5, RAID 6 or higher RAID level having parity information). All of the flash memory chips in a SSD or pendrive are the basic unit to be programmed with the sub-data. The non-volatile memory unit may also simply refer to the flash memory chip in a SSD or a portable storage device. Thus, the flash memory chips are the basic unit to be programmed. The flash memory chip may be a NAND flash memory chip. In practice, it can also be a NOR flash memory chip or a charge trap flash memory chip.

Then, the step is storing the parity in a volatile memory (S03). As mentioned above, parity and sub-data are stored in different kind of storing unit. Parity is temporarily stored in the volatile memory. The volatile memory may be a DRAM or a SRAM (Static Random Access Memory). The volatile memory and the non-volatile memory units can be assembled in the same device, e.g. in a SSD. They can be separated into difference hardware. For example, the flash memory chips are collected in a SSD and a DRAM module applied is connected to the host while the flash memory chips and the DRAM module are co-worked by the control of a control chip of the host.

Now, programming the write data into some of the non-volatile memory units with each sub-data being programmed into a corresponding non-volatile memory unit (S04). After programming, it is to determine if the programming (step S04) is successful or not (S05). If programming is successful, it is not necessary to recover any sub-data and the programming is ended (S06). However, if the result of step S05 is no, the write data needs to be recovered to complete programming. A step according to the present invention is recovering the sub-data in at least one program-failed non-volatile memory unit (two or more are recovered if the specification of RAID 6 or higher level is applied) with the parity in the volatile memory and other sub-data successfully programmed (S07). It is to find out the lost (not successfully programmed) by an inverse operation on the successfully programmed sub-data and the parity. There are many skills and algorithms in the art can be used. It is not limited by the present invention. If the second programming for the sub-data failed in programming again, step S05 and step S06 should also be repeated again until the sub-data is successfully programmed. After the programming is ended, the corresponding parity in the volatile memory can be dropped. The volatile memory (or a portion of the volatile memory) is released for further use.

Another aspects of the present invention disclosed here are a controller for recovering data in event of a program failure by using the method mentioned above and a storage system including the controller. The architecture of the controller and the storage system is shown in FIG. 2.

Figure 2:
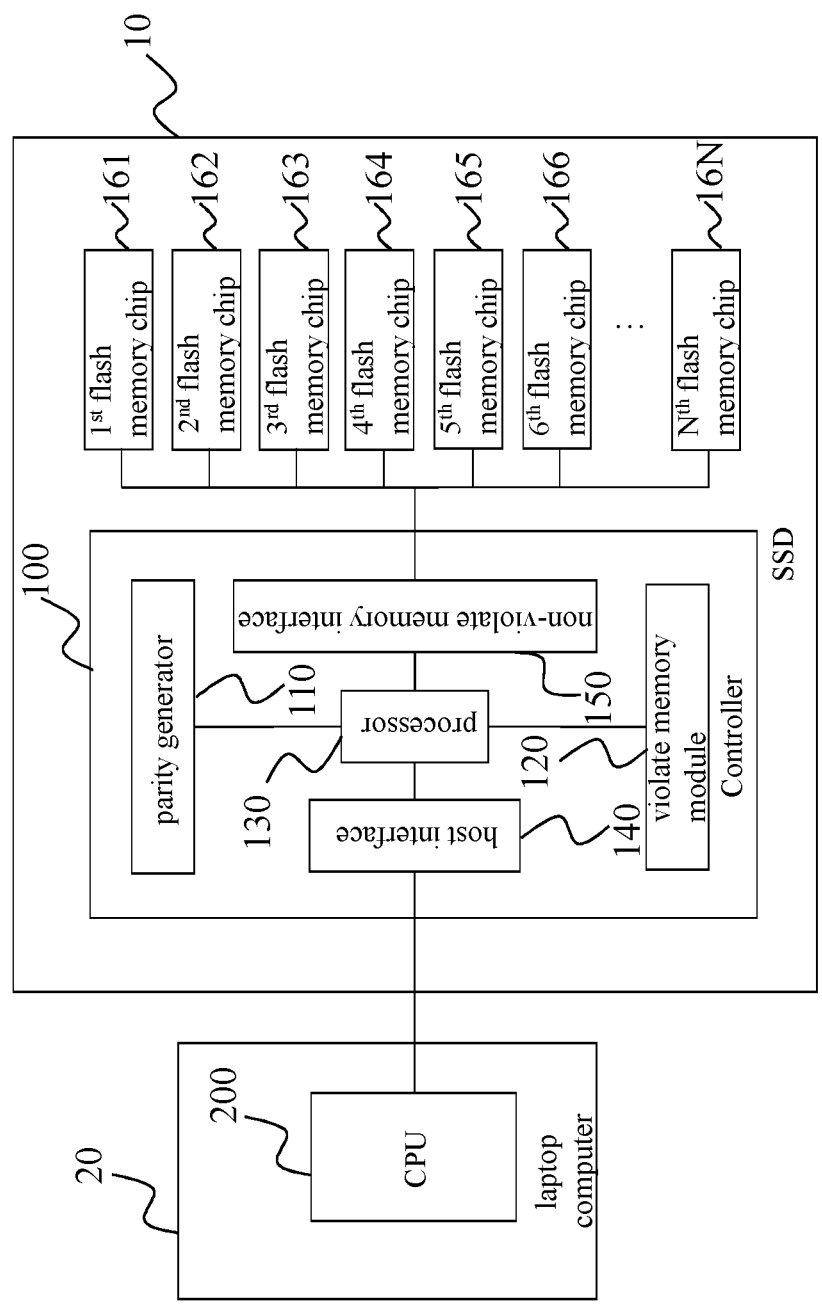
FIG. 2 is a schematic diagram of a controller for recovering data in event of a program failure and a storage system including the controller according to the present invention.

A SSD (storage system) 10 in FIG. 2 is composed of a controller 100 and an array of non-volatile memory units connected to the controller 100. In this embodiment, the non-volatile memory units are a first flash memory chip 161, a second flash memory chip 162, a third flash memory chip 163, a fourth flash memory chip 164, a fifth flash memory chip 165, a sixth flash memory chip 166, . . . , and a $N^{th}$ flash memory chip 161. Every flash memory chip has m pages of flash memory cells (please see FIG. 3). The controller 100 has 5 main units for carrying out the method of the present invention. They are a parity generator 110, a volatile memory module 120, a processor 130, a host interface 140 and a non-volatile memory interface 150. In other embodiments, the non-volatile memory units may be NOR flash memory chips or charge trap flash memory chips. The functions of each unit are illustrated below.

The parity generator 110 is a logic circuit. It can receive a write data from the processor 130 and generate a parity from the write data. The volatile memory module 120 is used to store the parity and provide the parity to the processor 130 when program fails. In this embodiment, the volatile memory module 120 is a DRAM module (it may be a SRAM module in other embodiment). The processor 130 is electrically connected with the parity generator 110 and the volatile memory module 120. Functions of the processor 130 is to receive the write data to be programmed into the non-volatile memory units, store the parity in the volatile memory module 120, separate the write data into a number of sub-data (according to the RAID specification applied), program each sub-data into a corresponding non-volatile memory unit, determine if programming each sub-data is successful and recover the sub-data in at least one program-failed non-volatile memory unit with the parity in the volatile memory module 120 and other sub-data successfully programmed.

The host interface 140 is electrically connected with the processor 130. It can externally communicate with a host 200 located in a laptop computer 20 and transmit the write data from the host 200 to the processor 130. In this embodiment, the host 200 is a CPU of the laptop computer 20. The SSD 10 is controlled by the CPU but is an externally connected storage device with respect to an internal SSD. It should be noticed that the host interface 140 may be an external connector, e.g. USB connector. The corresponding connecting interface, electronic devices and circuits between the host 200 and the host interface 140 are simplified and not shown. Those in the art are able to figure out the detailed designs so that it is not mentioned in the description of the present invention.

The non-volatile memory interface 150 is externally connected with the non-volatile memory units and electrically connected with the processor 130. Functions of the non-volatile memory interface 150 is to bridge communication for the non-volatile memory units and the processor 130. That is to say the processor 130 knows if programming is successful or not and processes data recovery through the non-volatile memory interface 150. The non-volatile memory interface 150 may be in a form of pins of the controller 100 (the controller 100 is an IC (integrated circuit) in the embodiment).

Figure 3:
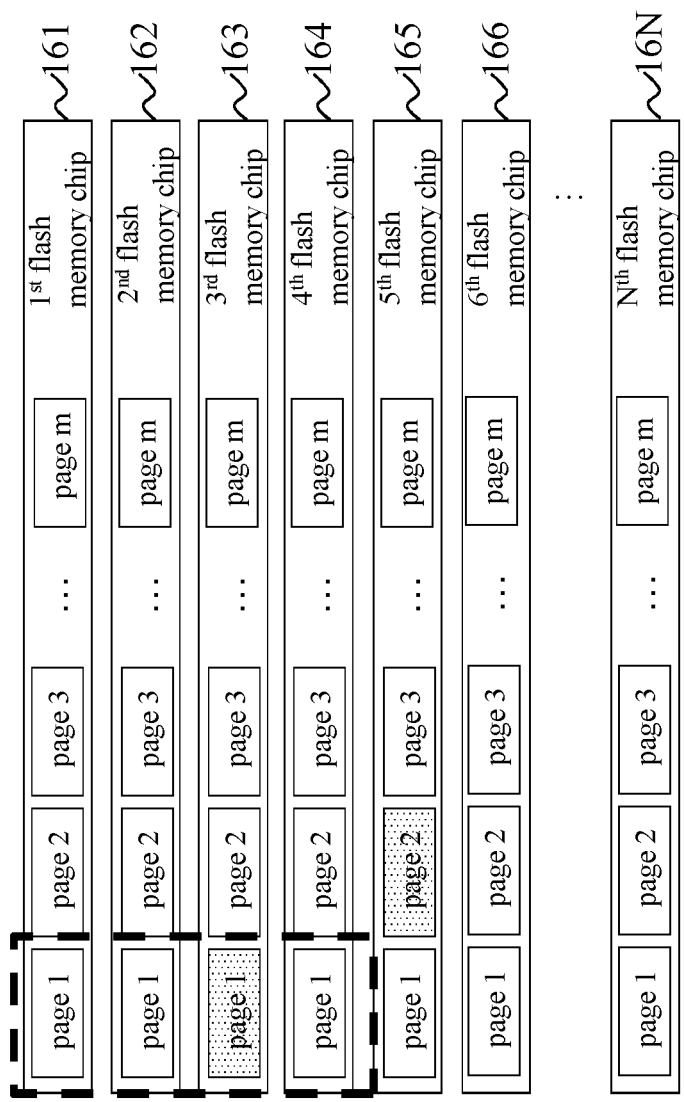
FIG. 3 shows pages in a number of non-volatile memory units.

Please refer to FIG. 3. The pages are the basic unit for the sub-data to be programmed into. Below is an example of data recovery in the pages. When the write data is about to program into the non-volatile memory units, the processor 130 programs a first sub-data into a page 1 of the first flash memory chip 161, a second sub-data into a page 1 of the second flash memory chip 162, a third sub-data into a page 1 of the third flash memory chip 163 and a fourth sub-data into a page 1 of the fourth flash memory chip 164. All programmed pages are enclosed by a dashed frame. The third sub-data is fail to be programmed into the page 1 of the third flash memory chip 163 (marked by dots in the background). The processor 130 calculates the lost third sub-data with the first sub-data, the second sub-data, the fourth sub-data and the parity in the volatile memory module 120. The third sub-data is calculated and will be programmed into a page 2 of the fifth flash memory chip 165.

In this embodiment, the non-volatile memory unit is a flash memory chip in the SSD 10. In application of the present invention, the non-volatile memory unit may be a page, a block or a plane in a flash memory chip. The storage system may not be the SSD 10 but a portable storage device.

From the description above, it is obvious that the present invention has below advantages for recovering data in event of a program failure in a flash-memory-based storage. First, conventional application of RAID with data recovery requires one or more disks for parities. The parities need to be stored till corresponding data is changed or removed. The method provided by the present invention saves the spare one. Secondly, the volatile memory module 120 doesn't have to temporarily store the complete write data and the corresponding parity. It can improve the efficiency of the volatile memory module 120. Thirdly, since less flash memory units are programmed for one write, life time of the storage system (SSD 10) can be extended.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A method for recovering data in event of a program failure, comprising the steps of:
   A. receiving a write data to be programmed into a plurality of non-volatile memory units;
   B. generating a parity from the write data and separating the write data into a plurality of sub-data;
   C. storing the parity in a volatile memory;
   D. programming each of the plurality of sub-data into some of the plurality of non-volatile memory units;
   E. determining if step D is successful; and F. if the result of step E is no, recovering the sub-data in at least one program-failed non-volatile memory unit with the parity in the volatile memory and other sub-data successfully programmed, wherein the recovered sub-data is stored in a non-volatile memory unit that is not among the ones which the sub-data are programmed into.

2. The method according to claim 1, wherein the sub-data are separated according to the specification of RAID (Redundant Array of Independent Disks) 5, RAID 6 or higher RAID level having parity information.

3. The method according to claim 1, wherein the non-volatile memory unit is a page, a block or a plane in a flash memory chip of a SSD (Solid State Disk) or a portable storage device.

4. The method according to claim 3, wherein the flash memory chip is a NAND flash memory chip, a NOR flash memory chip, or a charge trap flash memory chip.

5. The method according to claim 1, wherein the volatile memory is a DRAM (Dynamic Random Access Memory) or a SRAM (Static Random Access Memory).

6. A controller for recovering data in event of a program failure, comprising:
   a parity generator, for generating a parity from a write data;
   a volatile memory module, for storing and providing the parity; and
   a processor, electrically connected with the parity generator and the volatile memory module, for receiving a write data to be programmed into a plurality of non-volatile memory units, storing the parity in the volatile memory module, separating the write data into a plurality of sub-data, programming each of the plurality of sub-data into some of the plurality of non-volatile memory units, determining if programming each sub-data is successful, and recovering the sub-data in at least one program-failed non-volatile memory unit with the parity in the volatile memory module and other sub-data successfully programmed, wherein the recovered sub-data is stored in a non-volatile memory unit that is not among the ones which the sub-data are programmed into.

7. The controller according to claim 6, wherein the sub-data are separated according to the specification of RAID 5, RAID 6 or higher RAID level having parity information.

8. The controller according to claim 6, wherein the non-volatile memory unit is a page, a block or a plane in a flash memory chip of a SSD (Solid State Disk) or a portable storage device.

9. The controller according to claim 8, wherein the flash memory chip is a NAND flash memory chip, a NOR flash memory chip, or a charge trap flash memory chip.

10. The controller according to claim 6, wherein the volatile memory module is a DRAM module or a SRAM module.

11. The controller according to claim 6, further comprising:
    a host interface, electrically connected with the processor, for externally communicating with a host and transmitting the write data from the host to the processor; and
    a non-volatile memory interface, externally connected with the plurality of non-volatile memory units and electrically connected with the processor, for bridging communication for the plurality of non-volatile memory units and the processor.

12. A storage system including the controller according to claim 11, comprising:
    the plurality of non-volatile memory units which are externally connected to the processor of the controller via the non-volatile memory interface.

13. The storage system according to claim 12, wherein the sub-data are separated according to the specification of RAID 5, RAID 6 or higher RAID level having parity information.

14. The storage system according to claim 12, wherein the non-volatile memory unit is a page, a block or a plane in a flash memory chip of a SSD (Solid State Disk) or a portable storage device.

15. The storage system according to claim 14, wherein the flash memory chip is a NAND flash memory chip, a NOR flash memory chip, or a charge trap flash memory chip.

16. The storage system according to claim 12, wherein the volatile memory module is a DRAM module or a SRAM module.

* * * * *